United States Patent
Wright

(10) Patent No.: US 6,625,771 B2
(45) Date of Patent: Sep. 23, 2003

(54) TOOL TO RECONFIGURE PIN CONNECTIONS BETWEEN A DUT AND A TESTER

(75) Inventor: Adam Wright, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 42 days.

(21) Appl. No.: 09/816,647

(22) Filed: Mar. 22, 2001

(65) Prior Publication Data

US 2002/0019963 A1 Feb. 14, 2002

Related U.S. Application Data

(62) Division of application No. 09/262,761, filed on Mar. 4, 1999, now Pat. No. 6,247,155, which is a continuation of application No. 08/970,696, filed on Nov. 14, 1997, now Pat. No. 5,909,450.
(60) Provisional application No. 60/030,946, filed on Nov. 15, 1996.

(51) Int. Cl.⁷ .............................................. G01R 31/28
(52) U.S. Cl. ...................................................... 714/741
(58) Field of Search ................................. 714/724, 741; 716/4; 703/13–14

(56) References Cited

U.S. PATENT DOCUMENTS

| | | |
|---|---|---|
| 4,617,479 A | 10/1986 | Hartmann et al. |
| 4,871,930 A | 10/1989 | Wong et al. |
| 5,241,224 A | 8/1993 | Pedersen et al. |
| 5,260,611 A | 11/1993 | Cliff et al. |
| 5,311,122 A | 5/1994 | Fullerton et al. |
| 5,371,748 A | 12/1994 | Saw et al. |
| 5,923,567 A | 7/1999 | Simunic et al. |

OTHER PUBLICATIONS

Caunegre et al., Achieving simulation–based test programs verification and fault simulation capabilities for mixed–signal system IEEE, pp. 469–477, 1995.*
Xilinx Corp., "Xilinx Development Systems," The Programmable Logic Data Book, Third Edition, pp. 7–1 to 7–38 (1994).
Altera Corp., "MAX+PLUS II Programmable Logic Development System and Software," in altera Data Book, pp. 531–547 (1996).
Altera Corp., "EDA Software Support," in Altera Data Book 1996, pp. 577–588 (1996).

* cited by examiner

*Primary Examiner*—Albert Decady
*Assistant Examiner*—Shelly A. Chase
(74) *Attorney, Agent, or Firm*—Townsend and Townsend and Crew LLP

(57) ABSTRACT

An improved method of simulating the testing of integrated circuits is provided. A database of desired connections between a tester unit and a DUT for different downbonds is accessed by a multiplexer which sets up the desired connections. The system automatically makes the correct connection for each downbond without manual intervention from the user as was required in traditional simulator systems.

12 Claims, 4 Drawing Sheets

TOOL TO RECONFIGURE PIN CONNECTIONS BETWEEN A DUT AND A TESTER

This application is a divisional of U.S. application Ser. No. 09/262,761, filed Mar. 4, 1999U.S. Pat, No. 6,247,155; which is a continuation of U.S. application Ser. No. 08/970, 696, filed Nov. 14, 1997, now U.S. Pat. No. 5,909,450; which claims priority to U.S. Provisional Application No. 60/030,946, filed Nov. 15, 1996, the specifications of which are incorporated herein by reference for all purposes.

BACKGROUND OF THE INVENTION

The present invention relates generally to the testing of integrated circuits. More specifically, in one embodiment, the invention provides an improved computer simulation model of an integrated circuit testing system.

With the high level of complexity of modern integrated circuits, it is becoming increasingly difficult to test integrated circuits to ensure that they were manufactured with no defects. Typically, a device under test ("DUT") is tested by applying predetermined test waveform patterns its input pins. A tester generates the waveforms and monitors the DUT's output pins to ensure that the device operates as expected.

Often, the waveform patterns needed to adequately test the DUT are complex. Consequently, long lead times are needed to generate the waveform patterns and determine what results to expect on the output. Waiting for the first device to be manufactured for the waveform patterns and expected results to be tested is inefficient and costly.

To overcome this inefficiency, manufacturers have created software simulation models of the DUT and the tester to verify the accuracy of the waveforms before having physical parts available on which to test them. The waveforms may be applied to the software models, and the engineer can experiment and work the bugs out of the testing package before applying the waveforms to a physical device. This decreases the time it takes to perform the tests after manufacture of the devices, and prevents damage to the physical device by ensuring that the tester does not drive signals inappropriately.

Because of design considerations, a purchaser of an integrated circuit will sometimes prefer a package which has a fewer number of physical pins than are provided in a standard integrated circuit package. However, for ease of manufacturing, creating a different die for each of these customers may not be desirable for the manufacturer. Instead, the manufacturer often uses a common die, but places it in a package with fewer physical pins. Consequently, only a portion of the pads on the die are connected to a package pin. A fully-bonded package is one in which all pads on the die are connected to a package pin. A downbond is one in which only a subset of the pads are connected to a package pin.

In the past, these downbonds created a problem for the computer models used in the simulation of the devices. When a downbond was to be tested, a person running the test had to manually define which pins of the DUT model to connect to which pins of the tester. Therefore, each time a different downbond was tested, different connection had to be determined and waveform patterns had to be adjusted to correspond with the pin configuration of the new downbond. This method introduced the possibility of error, and was very time-consuming.

Accordingly, an improved method for simulating a device under test is desirable.

SUMMARY OF THE INVENTION

The present invention provides an improved method for simulating the testing of an integrated circuit. A computer model of a particular device under test ("DUT") is provided as is known in the art. A database containing a pin map correlating test parameters such as waveform patterns to the particular DUT is created. The test parameters are selectively applied to the DUT based upon the pin map in the database.

In an embodiment of the present invention, the method comprises the steps of: (1) providing a computer model of the DUT with a plurality of model pins corresponding to physical pins of the DUT; (2) creating a database with a pin map of desired connections between the DUT model pins and pins of the tester; (3) accessing the database; and (4) coupling the DUT model pins to the tester pins in accordance with the pin map.

Also provided, is a method of translating signals of a tester to signals recognizable by a DUT model, and a method of translating signals of a DUT model to signals recognizable by a tester. This is desirable since existing models have been incompatible in the past.

The present invention also provides a method of transferring additional information between the DUT and the tester by use of shadow connections. Shadow connections are made between the DUT and the tester according to the pin map of the database. Through these shadow connections, additional information may be obtained from the computer model that is not available form a physical tester.

A further understanding of the nature and advantages of the inventions presented herein may be realized by reference to the remaining portions of the specification and the attached drawings.

DETAILED DESCRIPTION OF THE SPECIFIC EMBODIMENTS

Figure 1:
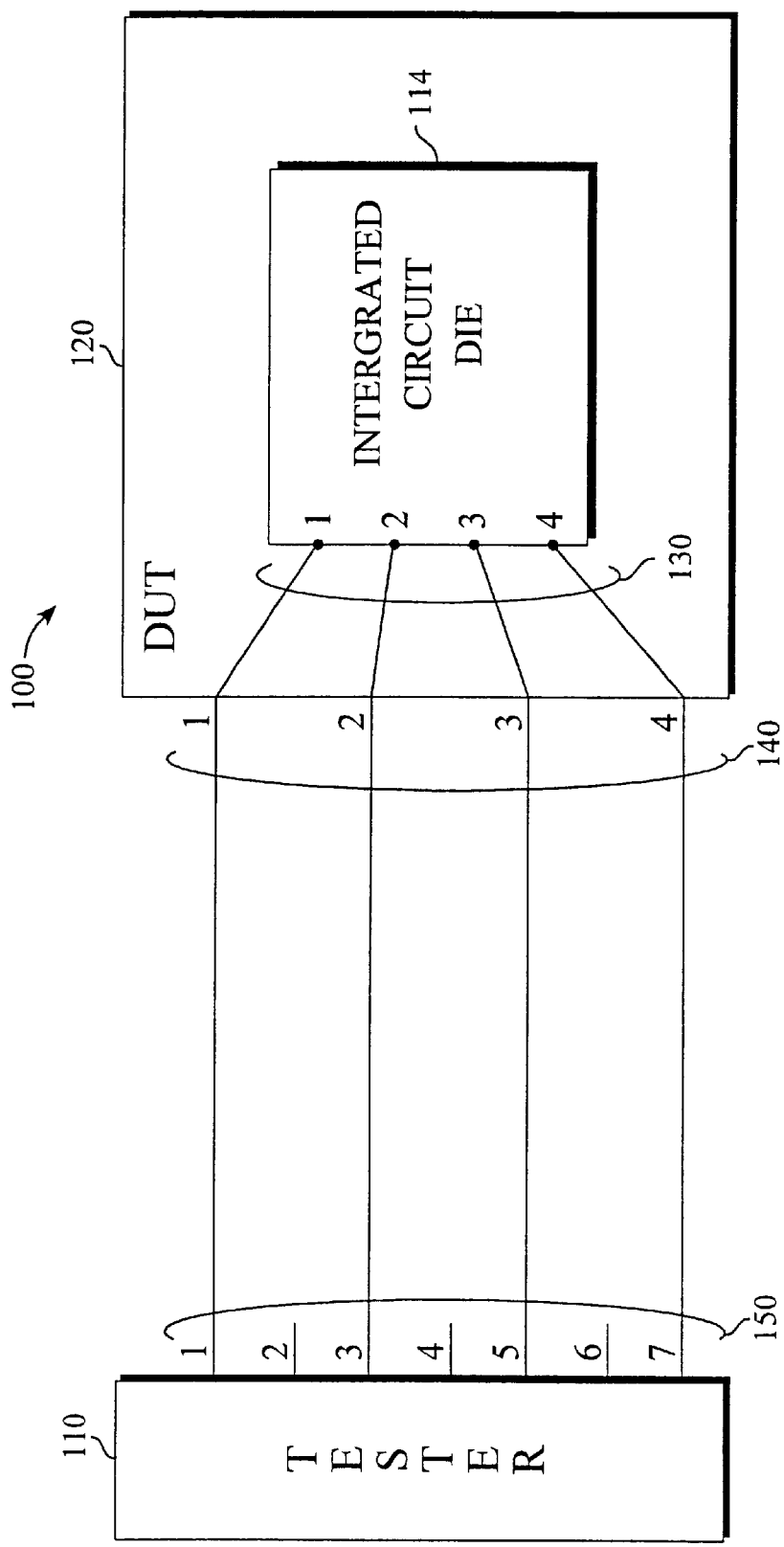
FIG. 1 is a block diagram of a typical integrated circuit test system.

FIG. 1 is a block diagram of a typical integrated circuit test system. The test system comprises a device under test ("DUT") 100 coupled with a tester unit 110. DUT 100 may be an integrated circuit, a programmable logic device, an FPGA, an EPLD, a EEPLD, a PLA, a PAL, a microprocessor, a disk drive, or other digital device or digital system. In an embodiment of the present invention, DUT 100 comprises an integrated circuit die 114 and a DUT package 120. Integrated circuit die 114 has I/O pads 130 through which it communicates with other devices. Although FIG. 1 depicts only four I/O pads for simplicity, a typical integrated circuit die may have many I/O pads. DUT package 120 has a plurality of DUT pins 140 which are electrically connected to I/O pads 130.

Typically, when a DUT package 120 is tested, it is placed in a test socket (not shown) on tester unit 110. This test socket provides tester pins 150 that electrically connect DUT pins 140 to tester unit 150. FIG. 1 conceptually shows these connections as the connections between DUT pins 140 and tester pins 150.

Testing parameters are applied to the DUT to test its validity. Typically, for example, tester unit 110 generates input waveforms for testing DUT 100 and interprets output waveforms from DUT 100. Tester unit 110 generates input waveforms and asserts them on the subset of tester pins 150 that are connected with the input pins of DUT 100. It receives waveforms on the subset of tester pins 150 that are connected to output pins of DUT 100.

This invention is directed toward computer modeling of the devices described above. Computer models of DUT 100 and tester unit 110 are created as is known in the art. The computer models may be created in any number of computer languages such as C, Verilog, Powerview, or VHDL. The computer models simulate the operation of tester unit 110 and DUT 100. The interface to the tester model is given through tester model pins. These tester model pins are computer representations of tester pins 150. The interface to the DUT model is given through DUT model pins that are computer representations of DUT pins 140.

Alternatively, rather than simulating both DUT 100 and tester unit 100, a computer model of DUT 100 may be interfaced with an actual physical tester unit. This allows the user to simulate the operation of a DUT with the actual tester for a more accurate test.

The test system of FIG. 1 depicts a fully bonded DUT. A fully bonded DUT is one in which each I/O pad 130 is connected to a DUT pin 140. As discussed above, having a device in which only a subset of I/O pads 130 connect to a DUT pin 140 is often desirable. This type of package is called a downbond. For example, a fully bonded DUT for integrated circuit die 114 would be a 4-pin device. A downbond would be a 1-, 2-, or 3-pin device.

Figure 2:
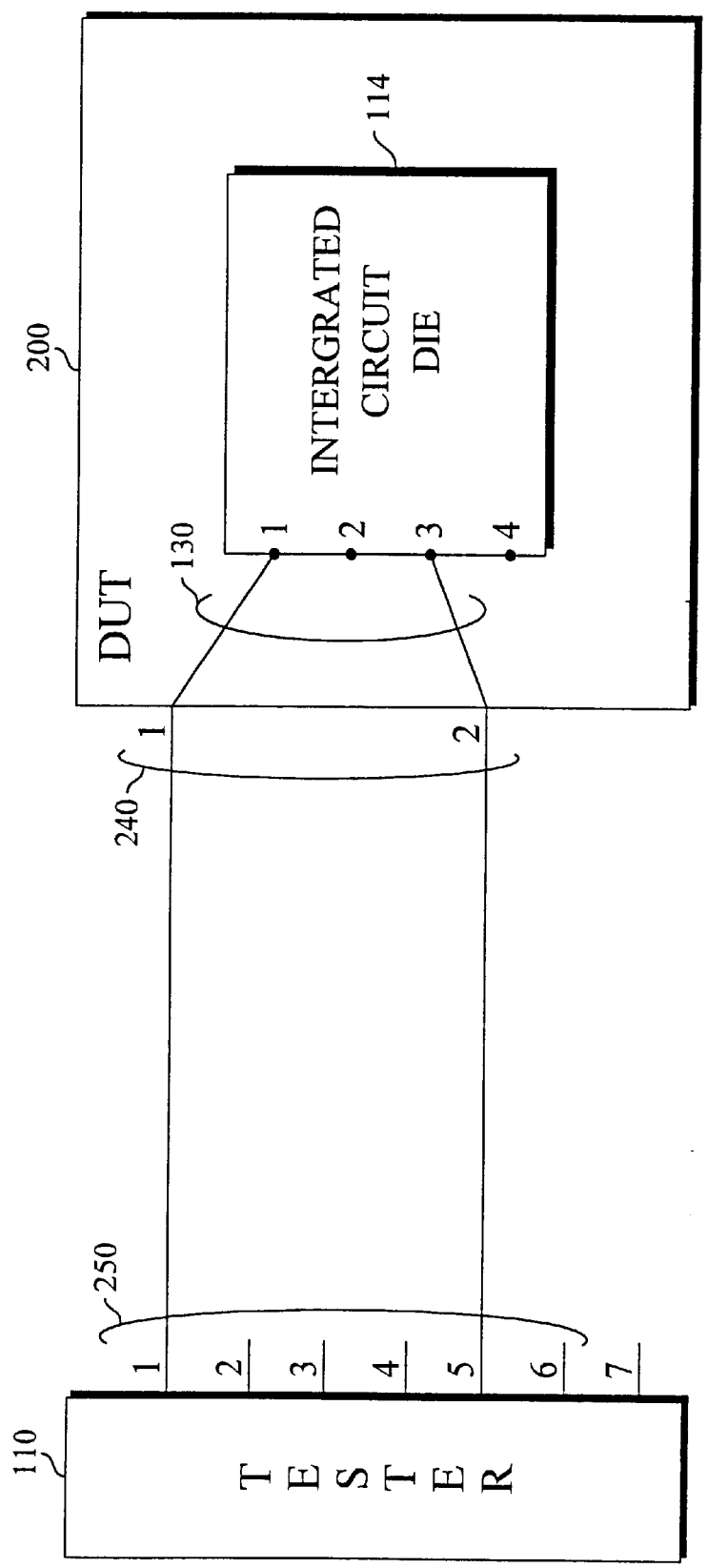
FIG. 2 is a block diagram of a downbond.

FIG. 2 depicts a downbond. Here, only I/O pad 130(1) and I/O pad 130(3) of integrated circuit die 114 are connected to DUT pins. Therefore, this is a 2-pin downbond. FIG. 2 illustrates a problem of currently available systems that the present invention solves. Different downbonds require a different mapping of DUT pins to tester pins. For example, in FIG. 1, DUT pin 140(2) connects to tester pin 150(3). However, in the downbond of FIG. 2, DUT pin 240(2) connects to tester pin 250(5). In the past, it has been necessary to manually make these connection for each simulation of a downbond and adjust the waveform patterns accordingly.

Figure 3:
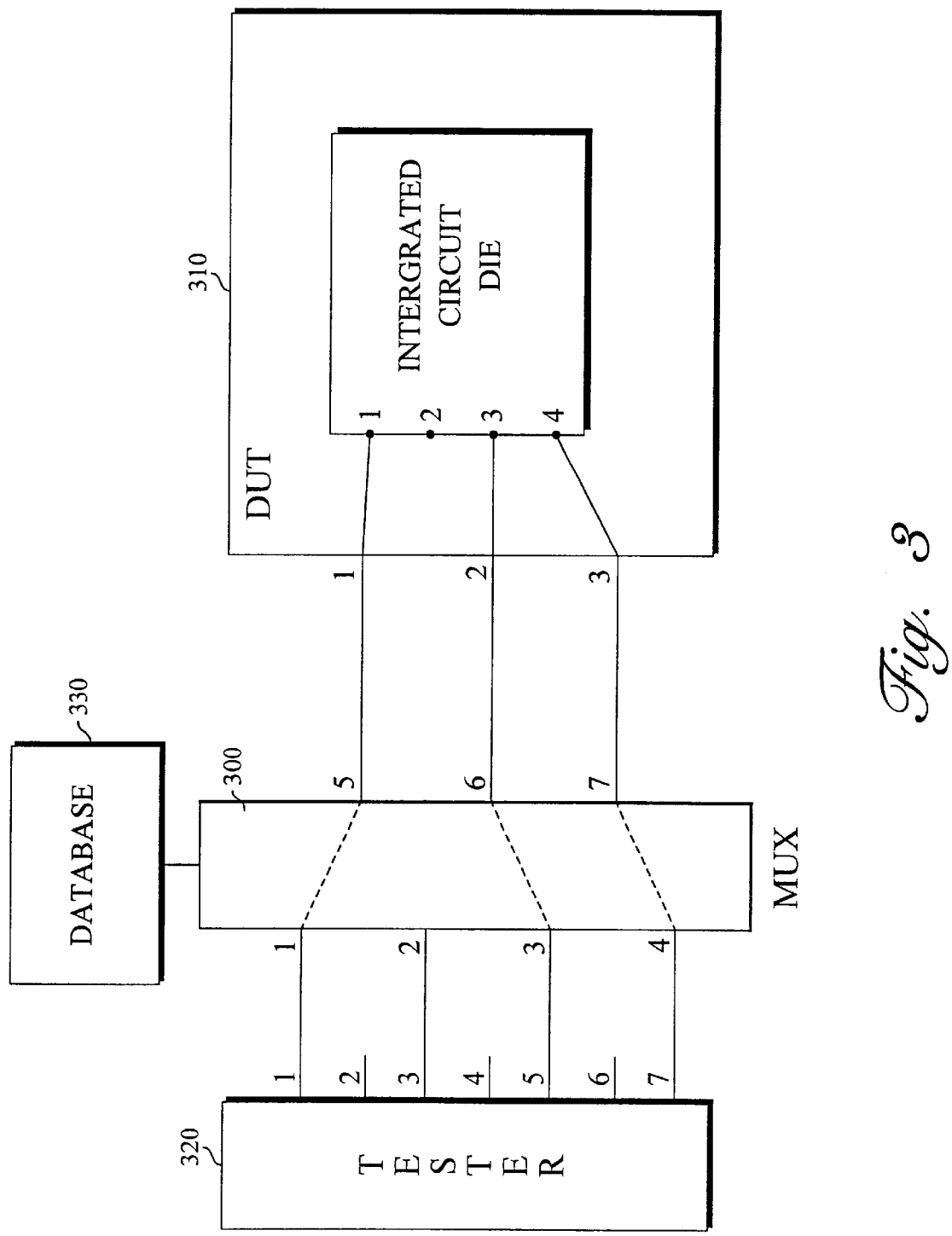
FIG. 3 is a block diagram of a test system having the multiplexer circuit and database of the present invention.

The present invention solves this problem by adding additional software components to the test system. FIG. 3 depicts a block diagram of one aspect of the present invention. A multiplexer model ("MUX") 300 is provided between DUT model 310 and tester model 320. MUX 300 provides selectable connections between DUT model 310 and tester model 320. For each downbond, the connections may be different.

The present invention also provides a database 330. Database 330 may be a look-up table that has a pin map for each downbond. MUX 330 references database 300 and provides connections according to the pin map. A designer need only enter the pin mapping information into the database once for each downbond and MUX 300 makes the proper routing according to the pin map.

Table 1 shows an embodiment of a pin map in database 330 for the downbond of FIG. 3. Column 1 of Table 1 lists the pin numbers of tester model 320. Column 2 indicates if the pin is a driver or a receiver (i.e., an input or an output signal.) A "0" indicates that it is a driver, and a "1"indicates that it is a receiver. Accordingly, in the example, tester pin 1 is a receiver (i.e., an input). Column 3 denotes the DUT model pin number which is to be connected to the tester pin listed in Column 1 for this downbond. Column 4 indicates if the DUT pin is a driver or receiver. Of course, the table may also include other information. For example, the table may include pin names, default logic values, or other useful information.

TABLE 1

| Tester Pin | Driver/Receiver | DUT Pin | Driver/Receiver |
| --- | --- | --- | --- |
| 1 | 1 | 1 | 0 |
| 5 | 0 | 2 | 1 |
| 7 | 0 | 3 | 0 |

In a preferred embodiment, MUX 300 is originally configured as it would be for a fully bonded implementation. Each tester pin and each DUT model pin are connected to MUX 300. MUX 300 provides connections between the devices as it would make them for the fully bonded DUT. MUX 300 then accesses database 330 to obtain the pin map information for a desired downbond. The connections between the two devices through MUX 300 are changed according to the pin map. The tester sends the waveforms as it would for the fully bonded DUT, but they get rerouted by MUX 300 to the proper DUT pin. In this manner, the waveforms need not be changed when a simulation is run on a downbond.

Software pointers may represent the connections between the devices and MUX 300. Each software pointer holds the address of the entry in database 330 corresponding to the pin making the connection to MUX 330. For example, the software pointer for the MUX connection associated with DUT pin 1 would hold the address of the first entry in Table 1. The pointer associated with tester pin 5 would hold the address of the second entry in Table 1, and so on.

A simulation test may be performed by sending waveforms from tester model 320 to DUT model 310 in the following manner. Tester model 320 sends a signal to MUX 300. MUX 300 transfers the signal to a DUT pin according to the connections that have been made. DUT 310 then receives the signal.

For example, to send a signal "A" from Tester pin 5 to DUT pin 2 in FIG. 3, the following procedure is followed. First, tester 320 sends signal A to MUX pin 3. MUX 300 transfers the signal to MUX pin 6 as specified in the database. DUT pin 2 then receives signal A from MUX pin 6.

Besides providing connection information, MUX 300 may also provide another function. Often, tester model 320 and DUT model 310 have different formats for the waveform signals. Therefore, the signals sent by one device are not recognizable by the other device. To make the models compatible, MUX 300 translates the signals to an appropriate format that the other model may recognize.

In a preferred embodiment, DUT model 310 recognizes, for example, four unique states for each signal. These states may be logical zero ("0"), logical one ("1"), undefined ("X"), and tristate ("Z"). On the other hand, tester model 320 may only recognizes two states, logical one ("1") and logical zero ("0"). Therefore, to represent each of the four states of DUT model 310, tester model 320 passes two bits. These two bits are a "logic bit" and an "xz bit". The "xz bit" is asserted when the state of the pin is undefined or tristate, and not asserted when the state is logical one or logical zero.

Table two shows the relationship between DU states and the tester bits in tabular format.

TABLE 2

| Name | DUT State | Tester logic bit | Tester xz bit |
|---|---|---|---|
| Logical Zero | 0 | 0 | 0 |
| Logical One | 1 | 1 | 0 |
| Undefined | X | 0 | 1 |
| Tristate | Z | 1 | 1 |

When tester model 320 sends a signal to DUT model 310, it may first send it to MUX 300. MUX 300 translates the signal according to Table 2. For example, if tester model 320 sends "0" as the logic bit and "1" as the xz bit, MUX 300 translates the signal to "X". DUT model 310 receives the "X" value, which it can recognize, instead of "01" which it may not recognize. Similarly, when DUT model 310 sends a signal to tester model 320, MUX 300 translates the signal to one that tester model 320 can recognize. For example, if DUT model 310 sends a "Z", MUX 300 translates it to a "1" on the logic bit and a "1" on the xz bit. Tester model 320 receives the two bits "11" which it can recognize.

Of course, different translations may be appropriate depending upon the tester model and the DUT model. Such translations will be readily determined by one of skill in the art and are anticipated by this invention.

Figure 4:
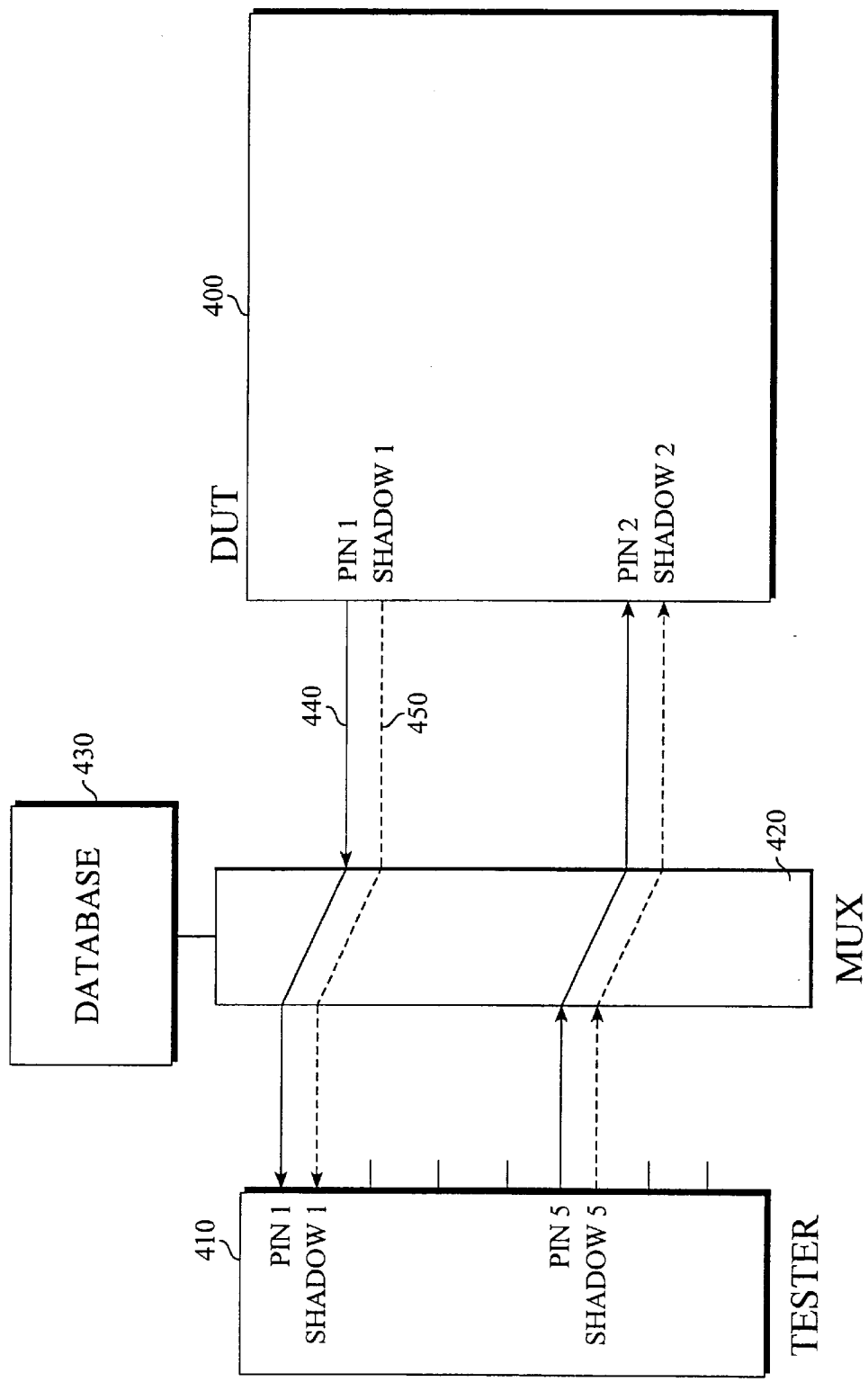
FIG. 4 is a block diagram of a test system depicting a shadow connection.

One advantage to simulating a test before running it with physical parts is the ability to have access to extra information that is not readily available from the physical part. Another aspect of the present invention takes advantage of this ability. In FIG. 4, a DUT model 400 and a tester model 410 are coupled together through a MUX 420 in the manner described above. MUX 420 receives connection information from pin maps in a database 430. In an embodiment of this aspect of the present invention, each of these connections may also be matched by a shadow connection. The shadow connection allows additional information to pass between DUT model 400 and tester model 410.

Shadow connection 450 may connect signals that are internal to the devices. For example, shadow connection 450 may be a connection between output enable block ("OEBs"). The OEB of the model does not correspond to an accessible physical pad on the integrated circuit die. Instead, it corresponds to the output enable line that gates the input/output driver for an integrated circuit die pad. A single OEB exists for each physical pin. The connections between OEBs of tester model 410 and DUT model 400 parallel connections between the integrated circuit die pads and the tester pins according to the pin map. FIG. 4 depicts an example of a connection between physical pins as physical connection 440, and between OEBs as shadow connection 450.

A purpose of modeling these OEBs is to detect when an output is being driven when it should not be, or not being driven when it should be. This allows the simulated test to ensure that damage will not occur to the physical parts when they are placed in the tester due to errors in the test patterns. For example, if the tester attempts to drive output pads of the integrated circuit the part may be damaged. Also, a test can determine when an output pin that should be driving at a certain time is not being enabled.

By monitoring the OEB pins, the tester may gain information on the state of the DUT model pin associated with it. For example, if the DUT model pin is an input, yet the OEB pin is asserted, then the system must have an error. A person of skill in the art can easily envision other uses of the OEB pins and the shadow connection in general. In another embodiment of the present invention, each pin may have more than one shadow connection if more information is desirable.

Although specific examples have been used to describe the present invention in detail, the examples given are not intended to limit, nor do they imply additional limitations to the present invention. The scope of the invention is limited only by the claims. A person of skill in the art may recognize many variations to the system that do not depart from the scope or spirit of the present invention. For example, different logic values, programming languages, data formats may be easily created. Such variations are included within the scope of this invention.

What is claimed is:

1. A method of testing a model of an integrated circuit, comprising providing a tester;

sending a first pattern recognizable by said tester from said tester to said integrated circuit model;

translating said first pattern to a second pattern recognizable by said integrated circuit model; and receiving said second pattern at said integrated circuit model;

wherein said first pattern comprises a first bit and a second bit said first bit and said second bit having a first state and a second state.

2. A method of testing a model of an integrated circuit comprising:

providing a tester;

sending a first pattern recognizable by said tester from said tester to said integrated circuit model;

translating said first pattern to a second pattern recognizable by said integrated circuit model; and receiving said second pattern at said integrated circuit model;

wherein said second pattern has at least four unique states.

3. A method of testing a model of an integrated circuit, comprising:

providing a tester;

sending a first pattern recognizable by said tester from said tester to said integrated circuit model;

translating said first pattern to a second pattern recognizable by said integrated circuit model;

receiving said second pattern at said integrated circuit model;

sending a third pattern recognizable by said integrated circuit model from said integrated circuit model to said tester;

translating said third pattern td a fourth pattern recognizable by said tester; and receiving said fourth pattern at said tester.

4. A test system for an integrated circuit comprising:

a model of said integrated circuit;

a model of said tester, said tester model comprising:
  a first I/O port corresponding to a pin of said tester, said first I/O port coupled with an I/O pad of said integrated circuit model; and a second I/O port coupled with the integrated circuit model wherein information relating to a state of an internal state of said integrated circuit model and an internal state of said tester model is transferable between said integrated circuit model and said tester model through said second I/O port.

5. The test system of claim 4 wherein said internal state of said integrated circuit model is a state of an output enable line for said integrated circuit.

6. The test system of claim 4 wherein said tester model internal state reflects a state of an output enable line for said tester model.

7. A method of testing a model of an integrated circuit, comprising;

providing a tester;

sending a first pattern recognizable by said tester from said tester to said integrated circuit model;

translating said first pattern to a second pattern recognizable by said integrated circuit model;

receiving said second pattern at said integrated circuit model; and associating the first pattern with a particular TIC) pad of the integrated circuit according to a database of pin mappings.

8. The method of claim 7 further wherein the database contains pin mappings describing connections between I/O pads of the integrated circuit and pins of a first integrated circuit package and between the I/O pads and pins of a second integrated circuit package.

9. The method of claim 7 wherein the first pattern is a test waveform for testing an integrated circuit.

10. A method of testing a model of an integrated circuit, comprising:

providing a tester;

sending a first pattern recognizable by said tester from said tester to said integrated circuit model;

translating said first pattern to a second pattern recognizable by said integrated circuit model;

receiving said second pattern at said integrated circuit model; and associating the first pattern with a particular 110 pad of the integrated circuit according to a database of pin mappings using a multiplexer model.

11. The method of claim 10 further wherein the database contains pin mappings describing connections between I/O pads of the integrated circuit and pins of a first integrated circuit package and between the I/O pads and pins of a second integrated circuit package.

12. A test system for an integrated circuit, comprising:

a model of an integrated circuit;

a tester;

means for transferring a first pattern recognizable by the tester to the integrated circuit;

means for translating the first pattern to a second pattern recognizable by the integrated circuit;

a first plurality of pins in the integrated circuit model; a second plurality of pins in the tester; and means for mapping the first plurality of pins to the second plurality of pins.

* * * * *